United States Patent [19]

Farrow et al.

[11] Patent Number: 4,468,685
[45] Date of Patent: Aug. 28, 1984

[54] INFRARED DETECTOR USING GREY TIN

[76] Inventors: Robin F. C. Farrow, Hill Mount, 190 Wells Rd., Malvern Wells, Worcestershire; Daniel S. Robertson, 205 Pickersleigh Rd., Malvern, Worcestershire, both of England

[21] Appl. No.: 325,431
[22] PCT Filed: Mar. 26, 1981
[86] PCT No.: PCT/GB81/00057
§ 371 Date: Nov. 19, 1981
§ 102(e) Date: Nov. 19, 1981
[87] PCT Pub. No.: WO81/02811
PCT Pub. Date: Oct. 1, 1981

[30] Foreign Application Priority Data

Mar. 27, 1981 [GB] United Kingdom ............... 8009588

[51] Int. Cl.³ .......................................... H01L 27/14
[52] U.S. Cl. .................................. 357/30; 357/16; 357/52; 357/61
[58] Field of Search ................... 357/30, 16, 61, 52

[56] References Cited

U.S. PATENT DOCUMENTS 2,865,793 12/1958 Nobel ............................ 357/61 X
3,615,856 10/1971 Sommers ....................... 357/30 X

FOREIGN PATENT DOCUMENTS 1356591 6/1974 United Kingdom ............... 357/30
2084396 4/1982 United Kingdom ............... 357/30

Primary Examiner—Andrew J. James
Assistant Examiner—W. Mintel
Attorney, Agent, or Firm—Cushman, Darby & Cushman

[57] ABSTRACT

A semiconductor device (1) including a monocrystalline region of semiconductor grey tin material (5) in intimate contact with a monocrystalline substrate (3). The region of semiconductor tin (5) is stabilized by interaction with the monocrystalline substrate (3) which has a crystallographic structure isomorphous with the structure of grey tin and an interatomic spacing matched to the interatomic spacing of the semiconductor region (5). The semiconductor region (5) may be further stabilized by inclusion of germanium dopant. The matching substrate (3) may be of indium antimonide, cadmium telluride, germanium or silicon material. Ohmic contact between a region of semiconductor tin (5) and a region of metal white tin (15) may be formed. Details of infra-red photovoltaic and photoconductive devices are given.

The semiconductor region of tin may be grown by molecular beam epitaxy.

8 Claims, 9 Drawing Figures

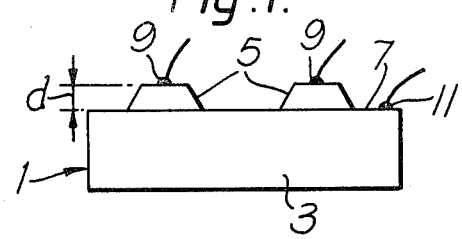
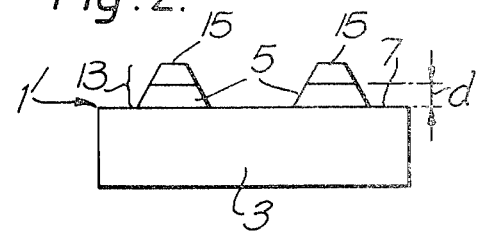
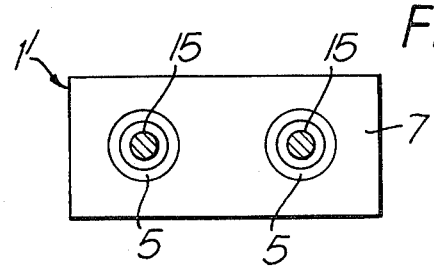
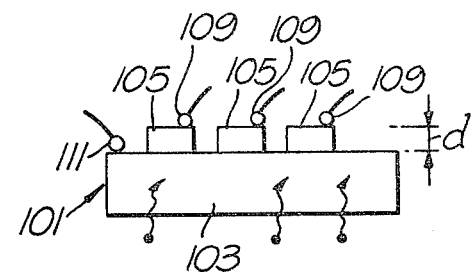
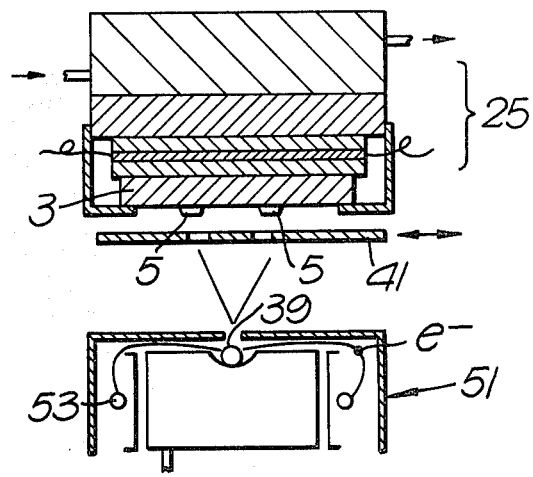
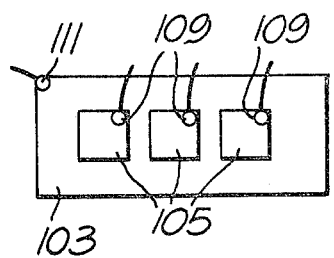
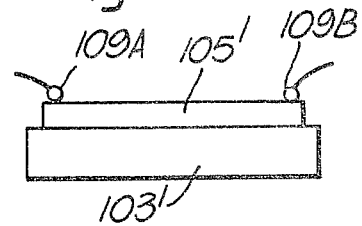

INFRARED DETECTOR USING GREY TIN

TECHNICAL FIELD

The invention relates to a semiconductor device and the manufacture thereof; particularly a semiconductor device having a monocrystalline region of semiconductor material in intimate contact with a monocrystalline substrate.

An example of such a device is one including, as semiconductor material, the material gallium arsenide. Regions of this material have been grown epitaxially, both gallium and arsenic, each a metallic material, being deposited in stoichiometric proportion by molecular beams produced in an ultra-high vacuum enclosure. This technique is described in the Journal of Applied Physics Vol 39 p. 4032 (1968) in an article by J. R. Arthur.

BACKGROUND ART

There is inherent in this technique the difficulty of ensuring stoichiometric proportion of the two components. Certainly in order to grow gallium arsenide by this technique it is necessary to supply gallium and arsenic vapors in such a ratio that the collisions between adsorbed gallium and impinging arsenic vapor is equal to the arrival rate of gallium. This requires careful control.

DESCRIPTION OF THE INVENTION

The semiconductor material silicon has also been grown epitaxially from a silicon beam in ultra high vacuum. For many device applications, contacts between metal leads and semiconductor silicon regions are required, particular care being necessary to ensure that such contacts are ohmic. This is a factor having considerable bearing on the economics of mass production of large scale integrated silicon devices where many such contacts are requisite.

Metal material has also been grown epitaxially on semiconductor substrates to provide either conductive contacts or metal Schottky barrier regions. For example, growth of high purity silver, aluminium or gold on indium phosphide has been achieved at growth temperatures of about 30° C., this being the lowest reported temperature for epitaxy of these metals on a III-V compound semi-conductor surface. (CF RFC Farrow et al, Proc 4th Int Conf on Vapour Growth and Epitaxy (ICVGE-4) Nagoya, Japan, July 9-13, 1978, and, RFC Farrow J Phys D, 10 (1977) L135).

Infra-red detectors including one or more regions of the semiconductor material cadmium mercury telluride $Cd_xHg_{1-x}Te$ (CMT) are known, and for particular values of the parameter x, eg x=0.21, these semiconductor regions are photo-sensitive to infra-red radiation in the 8 to 14 μm band of the spectrum. Both photo-voltaic and photo-conductive devices of CMT are known.

However, the ternary alloy cadmium mercury telluride is difficult to produce, is relatively expensive, and it is also difficult to produce regions of cadmium mercury telluride with substantial compositional uniformity. It is also a difficult material to incorporate in detector devices, mercury loss readily occurring under extreme temperature and vacuum conditions. Compositional variation leads to variation in the detectivity and spectral response and this can introduce pattern sensitivity in the output response of detector arrays, either linear or 2-dimensional, used in thermal imaging applications. Elaborate corrective circuitry is required to reduce the pattern sensitivity introduced in array output signals.

There is provided, in accordance with one aspect of the invention, a semiconductor device having a monocrystalline region of semiconductor material in intimate contact with a monocrystalline substrate *characterised in that* the region of semiconductor material is of gray tin stable over a range of temperature in excess of the bulk transition temperature between gray tin and white tin, the substrate being of a material with a crystallographic structure isomorphous with the structure of gray tin, with an interatomic spacing matched to within a tolerance of ±17% to the interatomic spacing of the semiconductor material over said range of temperature.

Germanium dopant may be introduced into the tin during the construction of the device, to afford stabilisation of tin layers of thickness greater than ~0.5 μm. The region therefore may be of semiconductor tin containing between 0.75 and 1.0% of germanium as substitution impurity dopant.

The device may be constructed to perform as an infra-red detector. The comparative advantages of this construction of detector is that the component tin is relatively inexpensive compared with the materials cadmium and tellurium. The region, or regions, may be produced by an evaporative technique and can be shaped readily by conventional masking or by subsequently applied photolithographic techniques. Being of a single element rather than of a ternary alloy, compositional variation is eliminated and extreme uniformity of sensitivity and spectral response can be achieved readily, given controlled distribution of dopant.

There is also provided in accordance with another aspect of the invention, a process adapted for the manufacture of the semiconductor device characterised as above, including:

providing a substrate of crystallographic structure isomorphous with the structure of gray tin, having an interatomic spacing matched, within said tolerance, to the interatomic spacing of gray tin, the substrate having a smooth, clean surface; providing a charge of tin of high purity;

treating said surface of the substrate, in an ultra high vacuum environment to remove impurities that otherwise would inhibit the nucleation of gray tin;

annealing the substrate to restore crystallographic order in said surface of the substrate;

forming from the charge a molecular beam; and, directing this beam onto said surface of the substrate to grow a deposit of tin thereon.

BRIEF DESCRIPTION OF THE DRAWINGS

Embodiments of the invention are now particularly described by way of example only and with reference to the accompanying drawings of which:

FIG. 1 is a side elevation of a semiconductor device incorporating features of the invention;

FIG. 2 is a side elevation of an assembly produced at a stage of a process during which a semiconductor device incorporating features of the invention is manufactured;

FIG. 3 is a plan view of the assembly of FIG. 2;

FIG. 5 is a schematic illustration of alternative apparatus;

FIGS. 7 and 8 are a side elevation and a plan view, respectively, of a detector array incorporating the features of the invention; and, FIG. 9 is a side view of a photoconductive device incorporating the features of the invention.

DESCRIPTION OF THE EMBODIMENTS

Figure 4:
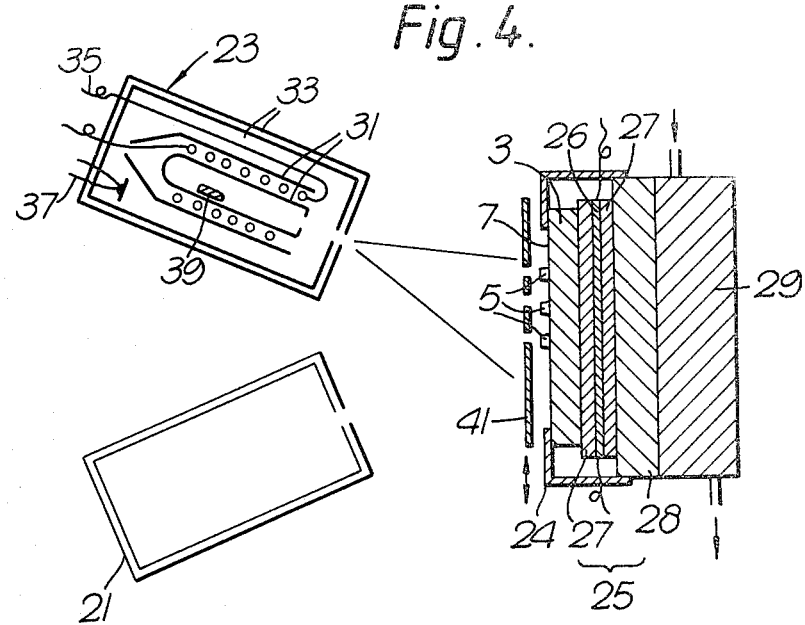
FIG. 4 is a schematic illustration of an apparatus used in performing a process including the steps characterising the invention.

There is shown in FIG. 1 a semiconductor device 1 comprising a monocrystalline substrate 3 of n-type doped indium antimonide (InSb) semiconductor material having two semiconductor regions 5 formed on its upper surface 7. These regions 5 are of gray ($\alpha$-phase) tin. Ohmic contacts 9, to the semiconductor regions, may be formed using pressure dots of indium. An additional ohmic contact 11 may also be provided by an indium pressure dot. The semiconductor regions 5 have each a trace content of an impurity dopant, e.g. boron, are each monocrystalline and, are in intimate contact with the substrate 3. They each provide thus a p-n diode junction in the region of intimate contact at the interface between the semiconductor gray tin 5 and the indium antimonide substrate 3. The semiconductor region 5 is of depth "d" having a thickness up to about 0.5 $\mu$m and remains in the $\alpha$-phase at temperatures in excess of 13.2° C., the temperature attributed to the phase transition between the semiconducting $\alpha$-phase (gray allotrope) of tin and the metallic $\beta$-phase (white allotrope) of tin. It is found, surprisingly, that these regions of tin 5 remain, for an indefinite period, >1½ years, in the semiconducting $\alpha$-phase over a range of temperature exceeding 13.2° C. up to an upper temperature limit of approximately 70° C. This stabilisation of the $\alpha$-phase is attributed to a surface interaction between the tin and the supporting substrate. Above this upper temperature limit the tin reverts to the metallic $\beta$-phase. It has also been found that where this upper temperature limit is exceeded and the device is cooled, the tin regions 5 will revert back to the $\alpha$-phase, a sharp transition occurring at about 60° C., the semiconductor regions 5 being re-formed.

The thickness "d" of the semiconductor regions 5 is limited by the finite range of the surface interaction, but this can be used to advantage to provide effective ohmic contact between semiconductor ($\alpha$-phase) gray tin and metal ($\beta$-phase) white tin as shown with reference to the assembly 1' shown in FIGS. 2 and 3 of the accompanying drawings. Here, thicker deposits 13 of tin are provided in intimate contact with the monocrystalline substrate 3. Over a range of temperature up to an upper temperature limit of about 70° C., each deposit 13 of tin is subdivided into two co-existing phase regions, a proximal region 5 which is of semiconductor $\alpha$-phase gray tin and a distal region 15 of metal $\beta$-phase white tin. An ohmic contact to each semiconductor region 5 is thus formed at the phase interface between the proximal and distal regions of the tin deposit 13. A semiconductor device may then be produced from this assembly 1' by the further provision of conducting leads.

An apparatus for producing the semiconductor device 1 or the assembly 1' is shown in FIG. 4. This apparatus includes an argon ion bombardment source 21 and a tin evaporation source, a Knudsen oven 23.

Both the source 21 and the oven 23 are mounted in an enclosure (not shown). They are each directed at the substrate 3 which is affixed by means of clips 24 to a supporting structure 25. This supporting structure 25 includes a heating element having a ribbon heater 26 sandwiched between two thin silica slides 27 in contact with a stainless steel plated block 28 of high thermal capacity. This block 28 is cooled by means of a heat exchanger 29 to enable cooling of the substrate 3 under operative conditions.

The oven 23 is principally of pyrolytic boron nitride (pBN) construction 31 and is surrounded by radiation shields 33, the innermost shields being of platinum (Pt), the outermost shields being of tantalum (Ta). Oven heating is provided by a molybdenum heater spiral 35. Oven temperature is monitored by a thermo-couple 37. The oven 23 has been loaded with a charge 39 of tin of very high purity ≮5N—e.g. Cominco 6N (total impurity content better than 11 p.p.m.).

The substrate 3 is of n-type indium antimonide, is formed of a monocrystalline slice of indium antimonide and has in this example a front surface 7 cut in the (100) plane. Alternatively, the slice may be cut in the (111)$_A$ or (111)$_B$ plane. This surface has been chemically cleaned. In this example the substrate 3 was supplied commercially by MCP Electronics Limited, Alperton Road, Wembley, England, being supplied as chemically treated to a mirror smooth, undamaged surface finish by a proprietary process.

The enclosure is pumped down to an ultra high vacuum (≮10$^{-9}$ Torr). The substrate surface 7 is subsequently treated to remove surface impurities—e.g. principally of oxygen (O$_2$) and carbon (C)—that would otherwise inhibit formation of the $\alpha$-phase of tin during subsequent deposit. To this end the substrate 3 is bombarded by argon ions of 500 eV energy from the source 21 at a current density of 1 $\mu$A/sq cm for a cycle of 30 minutes. The condition of the surface can be monitored in situ by Auger electron spectroscopy and the cycles repeated until the surface is atomically clean—i.e. with the front monolayer of atoms including less than 1 at .% total of impurity species.

The substrate 3 is annealed between each cycle to relieve stresses developed in the crystalline lattice and to restore crystallographic order, at a temperature of about 220° C. each for a period of about 30 minutes. Following this, in situ electron diffraction is used to confirm that the substrate surface is well ordered.

A patterned mask 41 of molybdenum or silicon, is then interposed and positioned between the substrate 3 and the oven 23, and the substrate is cooled to an initial temperature of about −20° C.

The oven 23, which initially is shuttered, is then heated to a temperature of about 1250° C. so that the tin charge 39 begins to evaporate and provide tin vapor at a vapor pressure of approximately 10$^{-2}$ Torr. The shutter (not shown) is then removed and the substrate 3 exposed to a molecular beam of tin; through the mask 41. With 10 cm spacing between the oven 23 and the substrate 3, a suitable growth rate of between 0.5 $\mu$m/hour to 5 $\mu$m/hour can be achieved, the substrate temperature being held below about 70° C. by cooling during this operation. This evaporation is continued until regions 5 (or 13) of tin of desired thickness are grown. Leads may then be formed in a subsequent stage of the process.

It is, in general, an advantage of the device 1 and the process particularly described above that the material tin and monocrystalline indium antimonide are readily available and are relatively inexpensive.

It will be understood that regions of tin 5 (or 13) of defined shape may be produced by means other than the mask 41. For example, the shaped regions 5 (or 13) may be shaped from an epitaxially grown monocrystalline tin film by photolithography and chemical etching or by ion beam milling of the film during subsequent process steps.

A further advantage of the assembly 1' is that the ohmic contacts 15 are produced together with the semiconductor regions 5 during a single evaporation step, metal $\beta$-tin nucleating after a critical thickness of semiconductor $\alpha$-tin ($\sim$0.5 $\mu$m) has been deposited, if evaporation is continued.

The crystallographic structure of indium antimonide is that of the zinc blende (ZnS) structure and is isomorphous with the structure of $\alpha$-phase (gray allotrope) tin, which has the structure of diamond. Also the interatomic spacing of indium antimonide $-6.479$ Å (at 18° C.) is closely matched to that of $\alpha$-phase tin $-6.489$ Å (at 20° C.), and the match is reasonably close over a wide range of temperature.

By this process, using pBN Knudsen oven 23, p-n diodes of p-type tin on n-type indium antimonide have been grown. The semiconductor tin had a p-carrier concentration of $\sim$1 to $5 \times 10^{19}$ cm$^{-3}$, the carrier origin being assigned to boron from the boron nitride cells used in the evaporation. The Sn—InSb p-n junctions exhibited electrical rectifying behavior with RoA values of about 1 to 10 and a measured hole mobility in the p-type $\alpha$-Sn of about 200 cm$^2$ v$^{-1}$ sec$^{-1}$.

Semiconductor tin can also be grown epitaxially in the manner described above, using instead of indium antimonide, a substrate of cadmium telluride. The surface can be polished by combined chemical and mechanical action using a solution of bromine in methanol, and a lower temperature can be used for the anneal treatment. The crystallographic structure of cadmium telluride, an insulating material, is also that of the zinc-blende structure, so is also isomorphous with the structure of $\alpha$-phase tin. Here the interatomic spacing is 6.480 Å (at 25° C.) and is also closely matched to the spacing of $\alpha$-phase tin. Cadmium telluride has a band gap of $\sim$1.5 eV, is greater than that of indium antimonide (0.18 eV) and is available in semi-insulating form at room temperature.

It is also possible that semiconductor tin may be epitaxially grown on a substrate of germanium or silicon. These have the diamond crystallographic structure. Germanium has an interatomic spacing $\sim$5.66 Å and silicon $\sim$5.43 Å and are not therefore as closely matched to the interatomic spacing of $\alpha$-Sn. They differ from $\alpha$-Sn by approximately 12.7% and 16.3% respectively—both are matched to $\alpha$-Sn within a tolerance of approx 17% over a wide range of temperature.

As shown in FIG. 5, tin is deposited by means of an electron gun (e-gun) source 51 in place of the oven 23. In this example tin atoms are ejected from the surface of the tin charge 39 under the bombardment of energetic electrons emitted from a cathode 53. Donor or acceptor impurities may be introduced from a similar auxiliary source simultaneous to $\alpha$-Sn growth or during a subsequent process step.

Figure 6:
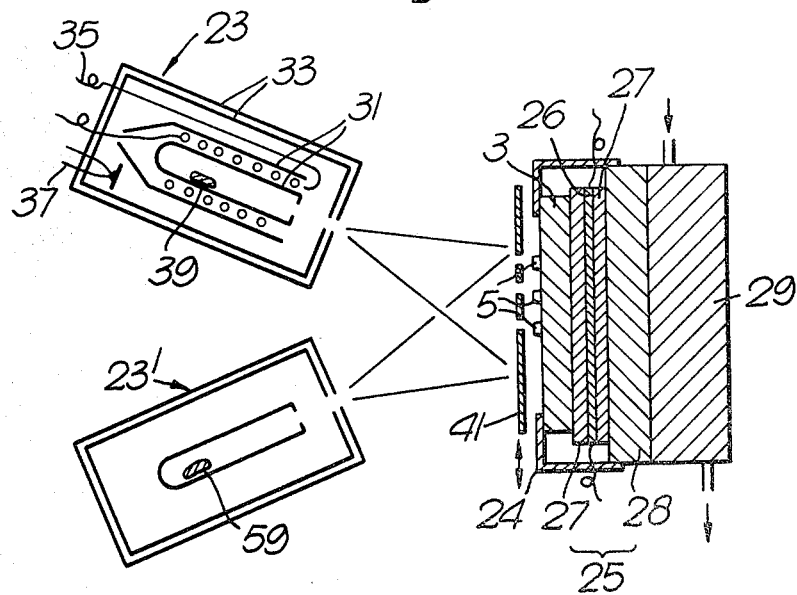
FIG. 6 is a schematic illustration of apparatus including a source for controlling substitutional impurity doping for a semiconductor device.

Substitutional impurity doping may be used to increase the thickness of the tin region 5 that may be made both semiconducting and stable. Thus in the apparatus shown in FIG. 6 there is used in addition to the oven 23 containing the charge 39 of tin, a second oven 23' containing a charge 59 and suitable dopant. During deposit of the tin, evaporation of the dopant 59 may take place simultaneously, during the whole of the deposit process. Alternatively, the dopant 59 can be introduced into the tin charge 39 in the oven 23 and both tin and dopant evaporated simultaneously. In the first example evaporation of the dopant may be discontinued to allow further growth of pure tin and the formation of ohmic contact regions of metal $\beta$-phase tin.

Using the material germanium as the substitutional dopant, evaporated at an oven temperature of about 1220° C., a content of between 0.75 at .% and 1.0 at .% germanium may be introduced. In this manner, doped semiconductor tin regions 5 have been grown up to about 1 to 2 $\mu$m thickness, which, provided the substrate temperature has been maintained at below about 70° C., have proved stable subsequently in the temperature range between 13.8° C. and $\sim$70° C. In the absence of temperature control of the substrate and with increase of substrate temperature somewhat above 70° C., a phase transition to metal $\alpha$-phase tin occurs and with substitutional impurity doping, as above, the regions grown have not readily reverted to the semiconductor $\alpha$-phase.

Cadmium telluride may also be grown epitaxially over the monocrystalline region 5 of $\alpha$-phase gray tin. As such it serves to passivate the surface, preventing exposure of the tin to atmospheric oxygen.

The devices produced by the above process may also be configured to perform as infra-red detecting devices.

There is shown in FIGS. 7 and 8 a linear array of three photovoltaic detector regions 105 of semiconductor grey tin ($\alpha$-phase) formed on a monocrystalline substrate 103 of n-type doped indium antimonide semiconductor material. Each region 105 has been epitaxially grown by the evaporative technique described above, each is monocrystalline and is in intimate contact with the substrate 103. Ohmic contacts to the semiconductor regions 105 are provided by indium pressure bonds 109, and a further ohmic contact to the semiconductor substrate 103 is provided by an indium pressure bond 111. Evaporated indium contact pads joined to gold or platinum leads by conducting epoxy resin may also be used for ohmic contacts to both semiconducting tin and indium antimonide.

The indium antimonide substrate acts as a window for infra-red radiation of wavelength $\lambda$ greater than the indium antimonide cut-off ($\sim$5.7 $\mu$m). The $\alpha$-phase grey tin ($\alpha$-Sn) absorbs radiation out to $\lambda$=E gap ($\alpha$-Sn)$\approx$9 $\mu$m for $\alpha$-Sn grown epitaxially as described below. The spectral response of each photodiode, thus formed, extends from 5.7 $\mu$m to 9 $\mu$m and thus extends in part to cover radiation transmitted through the 8 $\mu$m to 14 $\mu$m atmospheric infra-red window. Infra-red radiation in the 5.7 $\mu$m to 9 $\mu$m band falling on the detector array induces a photovoltage across each p-n junction and is measured across ohmic contact 109 and 111.

As shown in FIG. 9 a photo-conductive device is provided by an extended strip 105' of semiconductor tin having indium pressure bonds 109A, 109B providing ohmic contact at either end of the strip 105'. The strip has been formed by the process described above using a suitably modified mask, and is in intimate contact with an insulating substrate of monocrystalline cadmium telluride 103. When infra-red radiation of suitable wavelength (<9 $\mu$m) is incident on the strip, the conductivity of the strip 105' between contacts 109A, 109B, is changed by the generation of photocarriers in response to radiation absorbed in the strip 105'.

Sandwiched layers of α-Sn and cadmium telluride may be built up to increase the effective thickness of α-Sn available to absorb infra-red radiation.

What we claim is:

1. A semiconductor device, comprising:
   a monocrystalline substrate; and
   a monocrystalline region of semiconductor material in intimate contact with said substrate, said region of semiconductor material being grey tin stable over a range of temperature in excess of the bulk transition temperature between grey tin and white tin, the substrate being a material with a crystallographic structure isomorphus with the structure of grey tin, with an interatomic spacing matched within a tolerance of ±17% to the interatomic spacing of said semiconductor material over said range of temperature.

2. A semiconductor device according to claim 1 wherein said monocrystalline substrate material is selected from the group consisting of indium antimonide, cadmium telluride, germanium, and silicon.

3. A semiconductor device according to claim 1 further comprising a region of white tin in contact with said monocrystalline region of semiconductor material to form an ohmic contact for said semiconductor device.

4. A semiconductor device as claimed in claim 1 wherein the semiconductor material includes germanium dopant.

5. A semiconductor device as claimed in claim 1 further including a passivation layer of cadmium telluride over the region of semiconductor material.

6. An infra-red photovoltaic device comprising:
   a monocrystalline substrate of n-type doped indium antimonide material; and
   at least one monocrystalline region of semiconductor grey tin material in intimate contact and forming a p-n junction therewith.

7. An infra-red photoconductive device comprising:
   a monocrystalline substrate of cadmium telluride;
   a monocrystalline region of photoconductive grey tin semiconductor material in intimate contact therewith; and
   a pair of bias contacts spaced apart on the semiconductor material.

8. A device as claimed in claim 7 further comprising a monocrystalline layer of cadmium telluride material above and in intimate contact with the semiconductor material.

* * * * *